United States Patent
Okuda

(10) Patent No.: US 8,796,817 B2
(45) Date of Patent: Aug. 5, 2014

(54) SEMICONDUCTOR DEVICE

(71) Applicant: Mitsubishi Electric Corporation, Tokyo (JP)

(72) Inventor: Toshio Okuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/975,505

(22) Filed: Aug. 26, 2013

(65) Prior Publication Data

US 2014/0167282 A1  Jun. 19, 2014

(30) Foreign Application Priority Data

Dec. 13, 2012  (JP) .................................. 2012-272489

(51) Int. Cl.
*H01L 23/48* (2006.01)
*H01L 23/522* (2006.01)

(52) U.S. Cl.
CPC .................................. *H01L 23/5226* (2013.01)
USPC ................... 257/532; 257/686; 257/E21.008; 257/E23.062

(58) Field of Classification Search
USPC ........... 257/E23.079, 532, E23.062, E23.067, 257/686, E21.008
See application file for complete search history.

(56) References Cited

U.S. PATENT DOCUMENTS

| | | | | |
|---|---|---|---|---|
| 6,588,097 | B2 * | 7/2003 | Nishide et al. | 29/832 |
| 6,778,058 | B1 * | 8/2004 | Branchevsky | 336/200 |
| 7,350,296 | B2 * | 4/2008 | Ryu et al. | 29/852 |
| 7,750,247 | B2 * | 7/2010 | Chikagawa et al. | 174/260 |
| 8,720,050 | B2 * | 5/2014 | Chikagawa et al. | 29/834 |
| 2010/0212152 | A1 * | 8/2010 | Chikagawa et al. | 29/841 |

FOREIGN PATENT DOCUMENTS

| | | |
|---|---|---|
| JP | 6-302760 A | 10/1994 |
| JP | 7-30257 A | 1/1995 |
| JP | 2003-86950 A | 3/2003 |
| JP | 2006-237314 A | 9/2006 |

* cited by examiner

*Primary Examiner* — Julio J Maldonado
*Assistant Examiner* — Jaehwan Oh
(74) *Attorney, Agent, or Firm* — Leydig, Voit & Mayer, Ltd.

(57) ABSTRACT

A semiconductor device includes a multilayer substrate, a semiconductor element secured to an upper surface of the multilayer substrate, a first metal pattern located on a portion of a lower surface of the multilayer substrate, a dielectric having a higher permittivity than the multilayer substrate and located on the lower surface of the multilayer substrate, and a bottom surface electrode located on a bottom surface of the semiconductor device. The bottom surface electrode, the dielectric, and the first metal pattern together form a bypass capacitor.

2 Claims, 2 Drawing Sheets

SEMICONDUCTOR DEVICE

BACKGROUND OF THE INVENTION

Field of the Invention

The present invention relates to a semiconductor device used, e.g., as a part of a cellular phone.

Background Art

There are semiconductor devices in which a semiconductor element is mounted on a circuit substrate having a multi-layer substrate. Japanese Laid-Open Patent Publication No. H07-30257 discloses a technique in which a structure including a thin-film dielectric layer sandwiched between a ground layer and a power layer is formed in a multilayer substrate. More specifically, this technique is used to form a ground layer, a power layer, and a thin-film dielectric layer so as to form a capacitor in a circuit substrate. A semiconductor element such as an IC is mounted on the upper surface of the circuit substrate.

A power line for supplying a DC voltage to the semiconductor element is formed on the circuit substrate. In some cases, a capacitor is connected between the power line and ground so that the DC voltage is not affected by circuits or parts disposed around the semiconductor element, or by noise. This capacitor is referred to as a "bypass capacitor."

The bypass capacitor may be configured as a surface mount device (SMD) capacitor mounted on the upper surface of the circuit substrate. This, however, results in a decreased component mounting area of the upper surface of the circuit substrate. Especially, the use of many bypass capacitors makes it difficult to design the circuit substrate to have an adequate component mounting area.

In some cases, a ground pattern and a bottom surface electrode for supplying a DC voltage are formed on the lower surface side of the circuit substrate. In the case of the semiconductor device disclosed in the above publication, however, a bottom surface electrode cannot be formed on the lower surface of the circuit substrate, since a power layer and a ground layer are formed on the entire lower surface of the circuit substrate.

SUMMARY OF THE INVENTION

The present invention has been made to solve the above problems. It is, therefore, an object of the present invention to provide a semiconductor device whose circuit substrate has a bypass capacitor formed therein although the circuit substrate has a ground pattern and a bottom surface electrode formed on its lower surface side. The features and advantages of the present invention may be summarized as follows.

According to one aspect of the present invention, a semiconductor device includes a multilayer substrate, a semiconductor element secured to an upper surface of the multilayer substrate, an intra-substrate via connected electrically to the semiconductor element and formed in the multilayer substrate so as to extend to a lower surface of the multilayer substrate, a first metal pattern formed on a portion of the lower surface of the multilayer substrate, a second metal pattern formed in contact with a lower end of the intra-substrate via, a dielectric having a higher permittivity than the multilayer substrate and formed on the lower surface of the multilayer substrate so as to cover the first and second metal patterns, a first intra-dielectric via formed in the dielectric so as to be connected at an upper end thereof to the first metal pattern and extend to a lower surface of the dielectric, a second intra-dielectric via formed in the dielectric so as to be connected at an upper end thereof to the second metal pattern and extend to the lower surface of the dielectric, a ground pattern connected to a lower end of the first intra-dielectric via, and a bottom surface electrode connected to a lower end of the second intra-dielectric via. A portion of the first metal pattern is disposed on the dielectric directly above a portion of the bottom surface electrode, and the bottom surface electrode, the dielectric, and the first metal pattern together form a bypass capacitor.

Other and further objects, features and advantages of the invention will appear more fully from the following description.

DETAILED DESCRIPTION OF THE PREFERRED EMBODIMENT

A semiconductor device in accordance with an embodiment of the present invention will be described with reference to the accompanying drawings.

Throughout the specification the same or corresponding components are designated by the same reference symbols and may be described only once.

Embodiment

Figure 1:
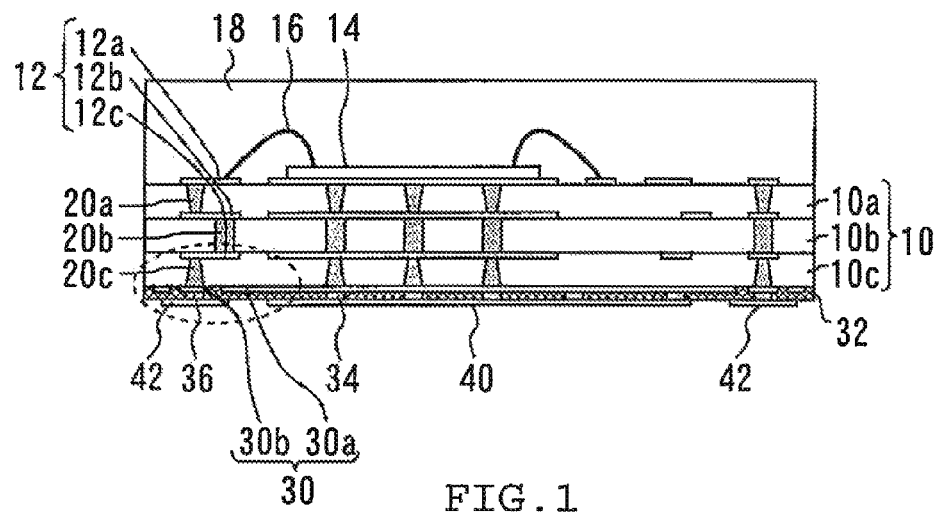
FIG. 1 is a cross-sectional view of the semiconductor device of the present embodiment.

FIG. 1 is a cross-sectional view of the semiconductor device of the present embodiment. This semiconductor device includes a multilayer substrate 10. The multilayer substrate 10 is made up of a substrate 10a, a substrate 10b, and a substrate 10c which are laminated together. The multilayer substrate 10 is formed of resin or ceramic.

A metal pattern 12a is formed on the substrate 10a, a metal pattern 12b is formed on the substrate 10b, and a metal pattern 10c is formed on the substrate 10c. The metal patterns 12a, 12b, and 12c are hereinafter referred to collectively as the metal pattern 12. The metal pattern 12 is used for transmitting high frequency signals.

A semiconductor element 14 is secured to the upper surface of the multilayer substrate 10. The semiconductor element 14 is, e.g., an amplifier formed by an FET, etc. In addition to the FET, semiconductor elements such as IC chips are secured to the upper surface of the multilayer substrate 10. The semiconductor element 14 is connected to the metal pattern 12a by a wire 16. The semiconductor element 14, the wire 16, and the metal pattern 12a are covered by a molded resin 18. It should be noted that the entire structure shown in FIG. 1 constitutes the semiconductor device of the present embodiment, and the portion of the semiconductor device excluding the semiconductor element is referred to herein as the circuit substrate.

Intra-substrate vias are formed in the multilayer substrate 10. Specifically, an intra-substrate via 20a is formed in the substrate 10a, an intra-substrate via 20b is formed in the substrate 10b, and an intra-substrate via 20c is formed in the substrate 10c. Thus the intra-substrate via 20c is formed in the multilayer substrate 10 and extends to the lower surface of the multilayer substrate 10. As can be seen from FIG. 1, the intra-substrate via 20c is electrically connected to the semiconductor element 14.

A first metal pattern 30a is formed on a portion of the lower surface of the multilayer substrate 10. A second metal pattern 30b is formed in contact with the lower end of the intra-substrate via 20c. A dielectric 32 is formed on the lower surface of the multilayer substrate 10 and covers the first metal pattern 30a and the second metal pattern 30b. The dielectric 32 is formed of a material having a higher permittivity than the multilayer substrate 10. The relative permittivity of the dielectric 32 is preferably, but not limited to, 1000 or more. The material of the dielectric 32 may be, e.g., $BaTiO_3$ paste.

A first intra-dielectric via 34 and a second intra-dielectric via 36 are formed in the dielectric 32. The upper end of the first intra-dielectric via 34 is connected to the first metal pattern 30a. The first intra-dielectric via 34 extends downward and is connected at its lower end to the lower surface of the dielectric 32. The upper end of the second intra-dielectric via 36 is connected to the second metal pattern 30b. The second intra-dielectric 36 extends downward and is connected at its lower end to the lower surface of the dielectric 32. A ground pattern 40 is connected to the lower end of the first intra-dielectric via 34. A left bottom surface electrode 42 (which is located on the left side of the semiconductor device, as viewed in FIG. 1) is connected to the lower end of the second intra-dielectric via 36. That is, the ground pattern 40, the left bottom surface electrode 42, and the dielectric 32 are exposed at the bottom surface of the circuit substrate of the present embodiment.

Figure 2:
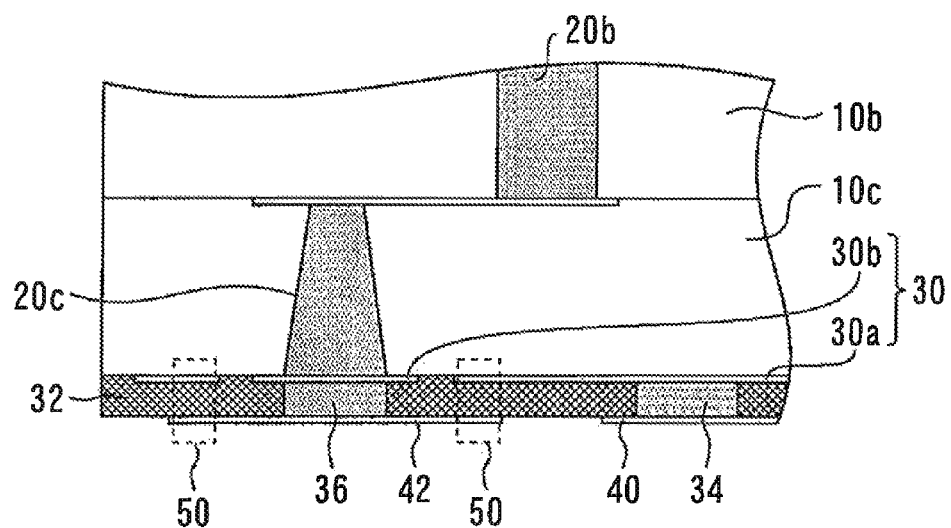
FIG. 2 is an enlarged cross-sectional view of the portion shown in the dashed line of FIG. 1.

FIG. 2 is an enlarged cross-sectional view of the portion shown in the dashed line of FIG. 1. A portion of the metal pattern 30a is disposed on the dielectric 32 directly above a portion of the left bottom surface electrode 42. As a result, the left bottom surface electrode 42, the dielectric 32, and the first metal pattern 30a together form a bypass capacitor 50. In FIG. 2, two portions of the bypass capacitor 50 are shown enclosed by dashed lines. The bypass capacitor 50 preferably has a capacitance of, e.g., 100-1000 pF.

Figure 3:
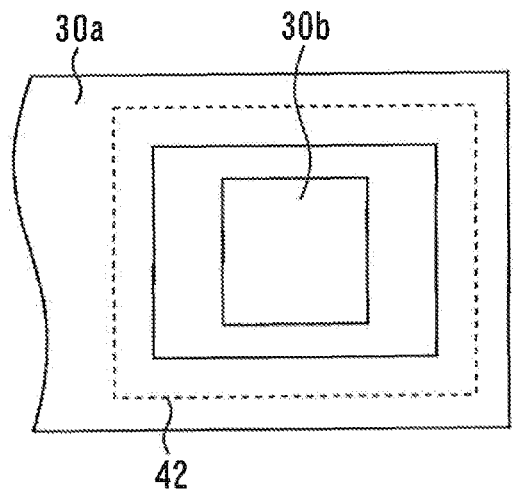
FIG. 3 is a plan view of the first metal pattern and the left bottom surface electrode.

FIG. 3 is a plan view of the first metal pattern and the left bottom surface electrode. The first metal pattern 30a is formed to have an opening The left bottom surface electrode 42 is indicated by a dashed line in FIG. 3.

There is an overlap between the first metal pattern 30a and the left bottom surface electrode 42, as viewed in plan.

Figure 4:
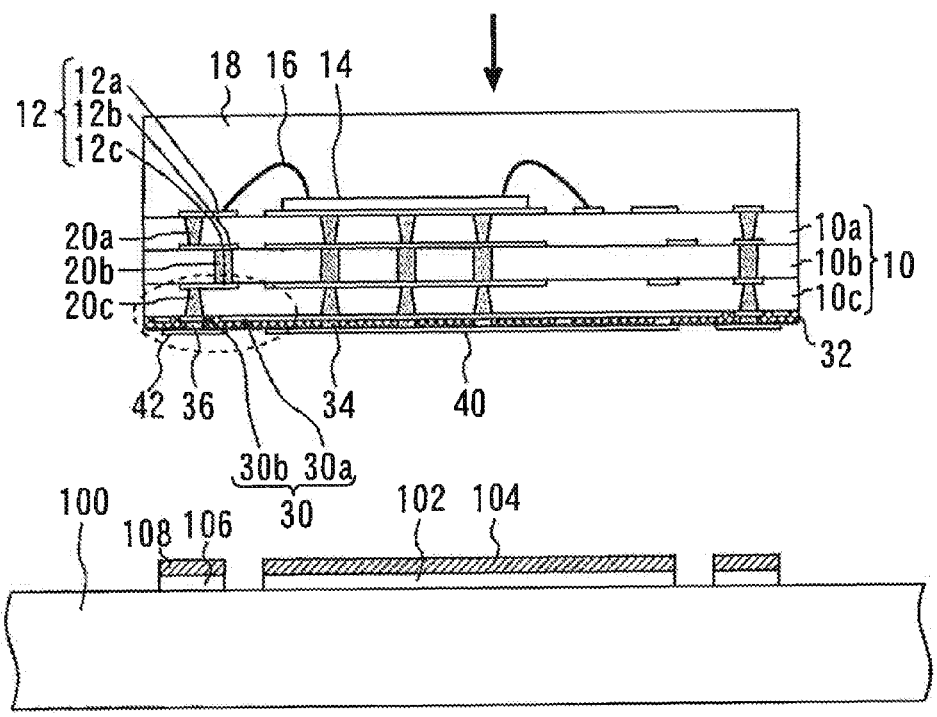
FIG. 4 is a cross-sectional view showing the way in which the semiconductor device of the present embodiment is mounted on a motherboard.

FIG. 4 is a cross-sectional view showing the way in which the semiconductor device of the present embodiment is mounted on a motherboard 100. The motherboard 100 has a ground electrode 102 formed thereon. Solder 104 is formed on the ground electrode 102. A power electrode 106 is formed adjacent the ground electrode 102. The power electrode 106 is used for supplying a DC voltage. Solder 108 is formed on the power electrode 106. As shown in FIG. 4, the ground pattern 40 is secured to the ground electrode 102 by the solder 104. Further, the left bottom surface electrode 42 is secured to the power electrode 106 by the solder 108.

A right bottom surface electrode 42 which has a similar configuration to the left bottom surface electrode 42 is disposed on the right side of the semiconductor device and connected to other components in the same manner as described above in connection with the left bottom surface electrode 42 (see FIG. 1). The left bottom surface electrode 42 constitutes a portion of the power line for supplying a DC voltage to the semiconductor element 14. Further, the right bottom surface electrode 42 constitutes a portion of the power line for supplying a DC voltage to other semiconductor elements (IC chip, etc.). A bypass capacitor is connected to each of these left and right power lines. This prevents the DC voltages supplied to the semiconductor elements from being affected by circuits or parts disposed around the semiconductor elements, or by noise.

The semiconductor element 14 may be used as a cellular phone amplifier. In such cases, in order to control the mode (GSM(TM), LTE, etc.) or the frequency of the system, it is necessary to form a plurality of DC voltage electrodes (or bottom surface electrodes) on the circuit substrate of the semiconductor device. If an SMD bypass capacitor is connected to each of these bottom surface electrodes, it is difficult to design the semiconductor device to have an adequate component mounting area. On the other hand, the bypass capacitor 50 of the present embodiment is made up of the first metal pattern 30a, the dielectric 32, and the left bottom surface electrode 42 and formed in the circuit substrate; that is, the bypass capacitor 50 is a "built-in" bypass capacitor. This means that the configuration of the semiconductor device of the present embodiment eliminates the need for SMD capacitors, making it possible to design the semiconductor device to be low-cost and have an adequate component mounting area. Further, in the semiconductor device of the present embodiment, the capacitance of the bypass capacitor 50 may be varied by varying the thickness of the dielectric 32, the surface area of the first metal pattern 30a, and/or the surface area of the left bottom surface electrode 42.

In the case of a circuit substrate that has an SMD capacitor mounted on its upper surface and a ground pattern formed on its lower surface (or bottom surface), the distance between the ground electrode of the capacitor and the ground pattern is substantially equal to the thickness of the circuit substrate.

This means that the grounding conductor connected between the ground electrode of the capacitor and the ground pattern is relatively long. Therefore, the conductor may be subjected to noise, etc., resulting in a change in the DC voltage supplied by the substrate. In the case of the circuit substrate of the present embodiment, on the other hand, the first metal pattern 30a functions as the ground electrode of the bypass capacitor and is connected by the first intra-dielectric via 34 to the ground pattern 40, which is formed on the bottom surface of the circuit substrate. The first intra-dielectric via 34, which serves a grounding conductor, is unlikely to be subjected to noise, etc. since it has a very short length (substantially equal to the thickness of the dielectric 32), making it possible to minimize change in the DC voltage supplied by the substrate.

The semiconductor device of the present embodiment is configured in such a manner that, for example, on the left side of the semiconductor device, the ground pattern 40 and the left bottom surface electrode 42 for supplying a DC voltage are formed on the lower surface side of the circuit substrate and the ground pattern 40 is connected to the first metal pattern 30a by the first intra-dielectric vias 34, thereby forming a bypass capacitor whose electrodes are portions of the first metal pattern 30a and the left bottom surface electrode 42. In this way, bypass capacitors are formed in the circuit substrate of the semiconductor device of the present embodiment although the circuit substrate has the ground pattern 40 and the bottom surface electrodes 42 formed on its lower surface side. Various alterations may be made to the semiconductor device of the present embodiment. For example, the dielectric 32 may be made of any material having a higher permittivity than the multilayer substrate 10.

Thus the present invention provides a semiconductor device whose circuit substrate has a bypass capacitor formed therein although the circuit substrate has a ground pattern and a bottom surface electrode formed on its lower surface side.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-272489, filed on Dec. 13, 2012, including specification, claims, drawings, and summary, on which the Convention priority of the present application is based, is incorporated herein by reference in its entirety.

What is claimed is:

1. A semiconductor device comprising:
   a multilayer substrate having upper and lower surfaces and a permittivity;
   a semiconductor element secured to said upper surface of said multilayer substrate;
   an intra-substrate via that is connected electrically to said semiconductor element and located in said multilayer substrate, extending to said lower surface of said multilayer substrate;
   a first metal pattern located on a portion of said lower surface of said multilayer substrate;
   a second metal pattern in contact with a lower end of said intra-substrate via;
   a dielectric having a higher permittivity than the permittivity of said multilayer substrate and located on said lower surface of said multilayer substrate, covering said first and second metal patterns;
   a first intra-dielectric via located in said dielectric, connected at an upper end to said first metal pattern, and extending to a lower surface of said dielectric;
   a second intra-dielectric via located in said dielectric, connected at an upper end to said second metal pattern, and extending to said lower surface of said dielectric;
   a ground pattern connected to a lower end of said first intra-dielectric via; and
   a bottom surface electrode connected to a lower end of said second intra-dielectric via, wherein
      a portion of said first metal pattern is disposed on said dielectric directly opposite a portion of said bottom surface electrode, and
      said bottom surface electrode, said dielectric, and said first metal pattern, together, constitute a bypass capacitor.

2. The semiconductor device according to claim 1, wherein said dielectric has a relative permittivity of at least 1000.

* * * * *